US007876165B2

(12) United States Patent
Li et al.

(10) Patent No.: US 7,876,165 B2
(45) Date of Patent: Jan. 25, 2011

(54) RING-BASED MULTI-PUSH VOLTAGE-CONTROLLED OSCILLATOR

(75) Inventors: Chao-Chieh Li, Hsin-Chu (TW); Chung-Chun Chen, Taipei (TW); Huei Wang, Taipei (TW)

(73) Assignee: National Taiwan University, Taipei (TW)

( * ) Notice: Subject to any disclaimer, the term of this patent is extended or adjusted under 35 U.S.C. 154(b) by 12 days.

(21) Appl. No.: 12/418,589

(22) Filed: Apr. 4, 2009

(65) Prior Publication Data

US 2010/0253440 A1    Oct. 7, 2010

(51) Int. Cl.
*H03K 3/03*    (2006.01)
(52) U.S. Cl. .............. 331/57; 331/107 C; 331/107 SL; 331/108 R
(58) Field of Classification Search .......... 331/45, 331/46, 50, 57, 96, 107 C, 107 SL, 108 R
See application file for complete search history.

(56) References Cited

U.S. PATENT DOCUMENTS 6,297,704 B1 * 10/2001 Nicholls et al. ............ 331/34

2005/0258911 A1 * 11/2005 Higuchi et al. ............. 331/57

OTHER PUBLICATIONS

Chao-Chieh Li, Chung-Chun Chen, Bo-Jr Huang, Pin-Cheng Huang, Kun-You Lin, and Huei Wang, "novel ring-based triple-push 0.2-to-34 GHz VCO in 0.13-m CMOS technology," IEEE MTT-S International Microwave Symposium Digest, Atlanta, GA, USA, Jun. 2008.

* cited by examiner

*Primary Examiner*—Joseph Chang
*Assistant Examiner*—Jeffrey Shin

(57) ABSTRACT

A ring-based multi-push voltage-controlled oscillator (VCO) generates a multi-push output signal using a control voltage. The ring-based multi-push VCO includes a plurality of delay cells, a plurality of buffer amplifiers, and a bias unit. The delay cells connect each other in sequence to form a ring structure, and each delay cell connects with the respective buffer amplifier. The bias unit connects with the buffer amplifiers to output the multi-push output signal. The control voltage supplied to the delay cells is utilized to control the frequency of the multi-push output signal, and the ring structure formed by the delay cells is to multiply the frequency of the multi-push output signal to increase the frequency tuning range.

6 Claims, 4 Drawing Sheets

RING-BASED MULTI-PUSH VOLTAGE-CONTROLLED OSCILLATOR

BACKGROUND OF THE INVENTION

1. Field of the Invention

The present invention relates to a ring-based multi-push voltage-controlled oscillator, and more particularly to utilizing a plurality of delay cells to form a ring-based structure for multiplying the frequency of the output signal of the oscillator.

2. The Prior Arts

The A voltage-controlled oscillator (VCO) is needed for the local oscillator in the integration of a phase-locking loop (PLL) or a microwave communication system. The VCO is usually used with a mixer to reduce a radio frequency signal to a low frequency signal for demodulation or modulate the low frequency signal with the radio frequency signal for transmission. In a wired communication system, the VCO provides an important reference frequency for the local oscillator in the timing circuit, such as sampling, multiplexer or demultiplexer.

The prior art oscillator usually includes the architecture of an LC tank, but the main problem of the architecture is that the circuit can not widely tune the output frequency. Moreover, of the oscillator is considerably bulky.

Although the architecture of multi-push VCO was proposed before, it still used the LC tank, and thus not only the design of the multi-push VCO is not easy to implement but also the frequency tuning range of the multi-push VCO is limited. For a ring-base VCO, The frequency tuning range is wider, but the controlling frequency is still constrained.

SUMMARY OF THE INVENTION

An objective of the present invention is to provide a ring-based multi-push VCO which includes a plurality of delay cells, a plurality of buffer amplifiers, and a bias unit. Each delay cell receives a control voltage for controlling the signal frequencies of the ring-based multi-push VCO, the power source terminal of each delay cell connects with a power voltage, and the ground terminal of the delay cells connects with ground, wherein each delay cell comprises a NMOS transistor, a PMOS transistor, and a thin-film microstrip (TFMS) line that is used to equalize the phase of the output signal of the delay cells.

The delay cells are connected in sequence to form a loop, wherein the output of the previous delay cell is the input of the next delay cell, and the output of the last delay cell is the input of the first delay cell. The output of each delay cell connects with a respective buffer amplifier. The bias circuit for the respective buffer amplifier includes a bias inductor and an isolated capacitor. The bias inductor is used to conduct a bias current from a buffered supply voltage to the respective buffer amplifier so as to sustain the buffer amplifier in an appropriate working state. The triple-push output signal is generated via the buffer amplifier for the output of the respective delay cell to be combined at the output node which is the intersection of the bias inductor and the isolated capacitor.

The present invention can improve the above-mentioned drawbacks of the prior arts by using the delay cells and buffer amplifiers to multiply the frequency of the triple-push output signal to increase the tuning frequency range and operation frequency. In addition, equalizing the phase of output signals with the TFMS line is to enhance the output power, the fundamental and second harmonic rejections. The ring-based architecture without occupied inductors is to shrink the area of the circuit.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The ring-based multi-push VCO according to exemplary embodiments of the present invention will now be described in detail with reference to the accompanying drawings.

Figure 1:
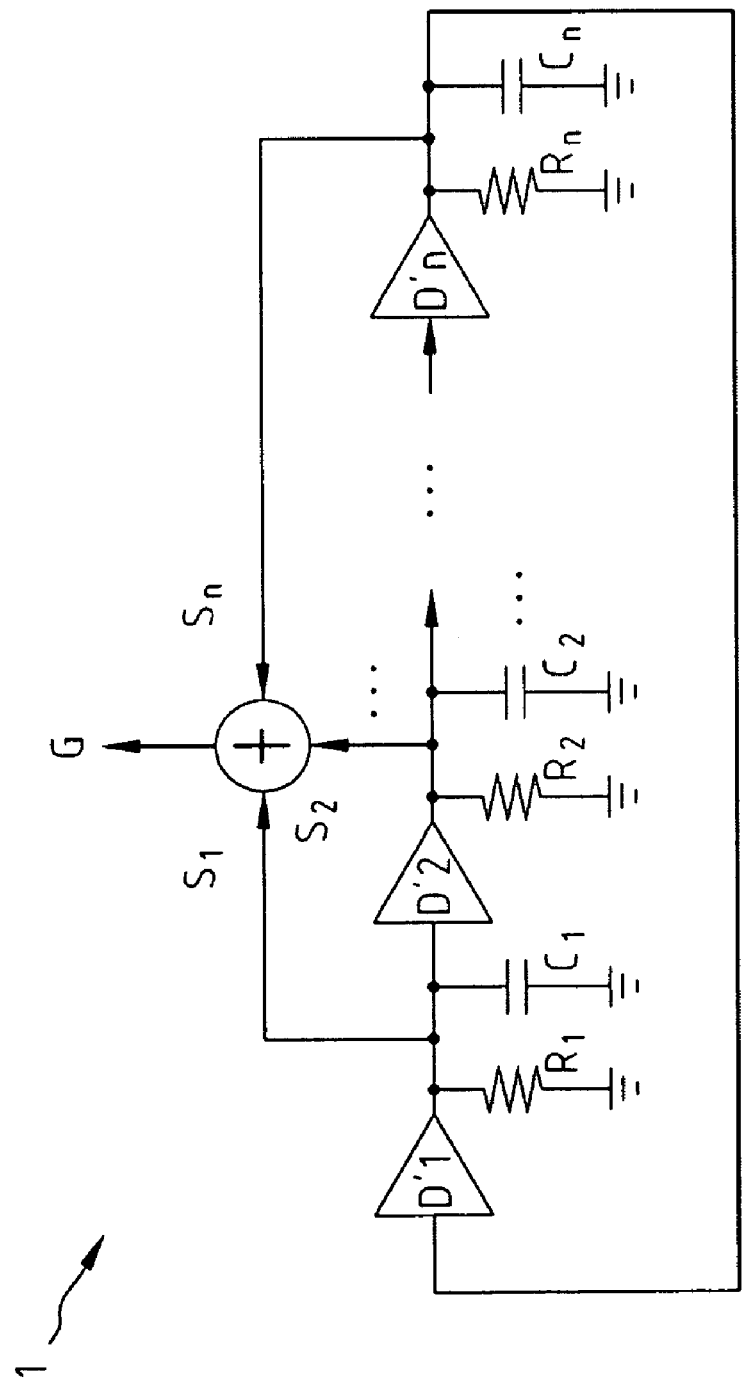
FIG. 1 is a schematic diagram illustrating a ring-based multi-push VCO according to the present invention.

FIG. 1 shows a ring-based multi-push VCO in accordance with the present invention. The ring-based multi-push VCO 1 includes a plurality of delay cells D'1, D'2, ..., D'n, a plurality of resistances R1, R2, ..., Rn, and a plurality of capacitances C1, C2, ..., Cn. The delay cells connect in sequence to form a loop, wherein the input of the next delay cell is the output of the previous delay cell, and the input of the first delay cell is the output of the last delay cell.

The delay cells D'1, D'2, ..., D'n can be implemented with the differential or single outputs, and the inputs of the delay cells D'1, D'2, ..., D'n can also be differential or single inputs. When the output of the delay cells is differential, the buffer amplifier is differential, and when the output of the delay cells is single, the buffer amplifier is single.

If the number of the delay cells D'1, D'2, ..., D'n in the ring-based multi-push VCO 1 is n, the ring-based multi-push VCO 1 is referred to as a ring-based n-push VCO. For the ring-based n-push VCO, the frequency tuning range increases n times than the original frequency. In the ring-based n-push VCO, except the nth order harmonic frequency, other harmonic frequencies are cancelled out completely due to phase destructive combination, and thus the multi-push output signal G is the in-phase constructive combination of the output signals S1, S2, ..., Sn of the delay cells D'1, D'2, ..., D'n.

The inputs and outputs of all the delay cells in the following diagrams are single inputs and single outputs for explanation of the characteristics of the present invention. Therefore, it should be noted that, practically, the inputs and outputs of the delay cells can be differential or single.

Figure 2:
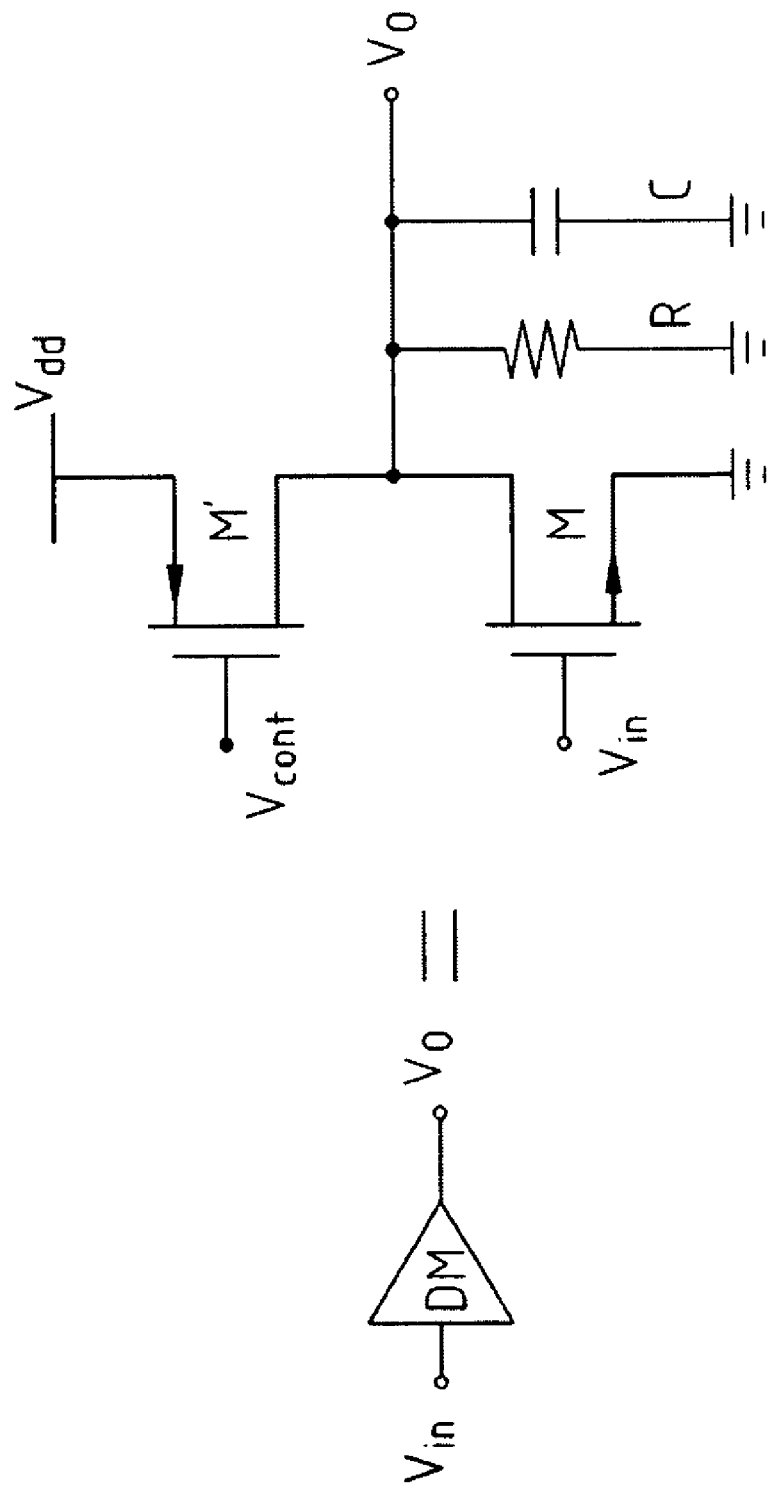
FIG. 2 is a schematic diagram illustrating the circuit of the delay cell of the ring-based multi-push VCO according to the present invention.

FIG. 2 is a diagram illustrating the circuit of the delay cell of the ring-based multi-push VCO according to the present invention. The delay cell DM comprises a plurality of transistors M and M', a delay resistance R, and a delay capacitance C. The source of the transistor M connects with the source of the transistor M', the gate of the transistor M is supplied with an input voltage Vin, and the gate of the transistor M' is applied by a control voltage Vcont for tuning the delay cell DM. The drain of the transistor M is supplied to a power voltage Vdd, and the transistors M and M' can be transconductance transistor and active load transistor.

Figure 3:
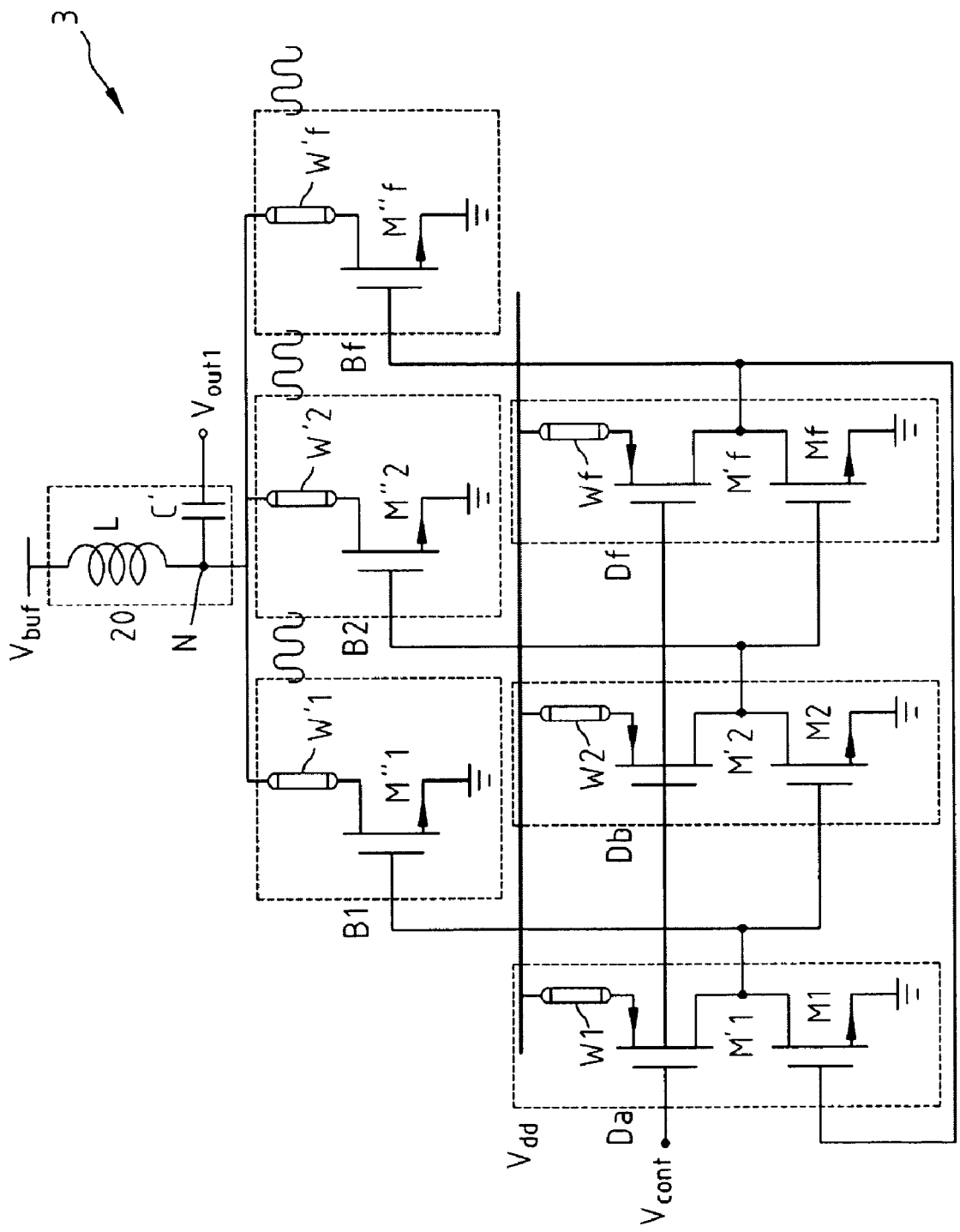
FIG. 3 is a schematic diagram illustrating the first embodiment according to the present invention.

FIG. 3 is a diagram illustrating the first embodiment according to the present invention with the use of three delay cells to implement the ring-based triple-push VCO 3 so as to explain the technological skills of the present invention. However, the present invention can be a ring-based multiple-push VCO that has a plurality of delay cells. The ring-based triple-push VCO 3 comprises a first delay cell D1, a second delay cell D2, a last delay cell Df, a first buffer amplifier B1, a second buffer amplifier B2, a last buffer amplifier Bf, and a bias unit 20. The first delay cell D1, the second delay cell D2, and the last delay cell Df receive a control voltage Vcont for controlling the frequency of the ring-based triple-push VCO 3. When the control voltage Vcont increases, the signal frequency decreases.

The power source terminals of the first delay cell D1, the second delay cell D2, and the last delay cell Df connect with the power voltage Vdd. The ground terminals of the first delay cell D1, the second delay cell D2, and the last delay cell Df are grounded. The output of the first delay cell D1 connects with the input of the second delay cell D2, the output of the second delay cell D2 connects with the input of the last delay cell Df, and the output of the last delay cell Df connects with the input of the first delay cell D1 to form a ring-based oscillator.

The input of the first buffer amplifier B1 connects with the output of the first delay cell D1, the input of the second buffer amplifier B2 connects with the output of the second delay cell D2, and the input of the last buffer amplifier Bf connects with the output of the last delay cell Df. The output of the first buffer amplifier B1, the output of the second buffer amplifier B2, and the output of the last buffer amplifier Bf connect together with a common node N. The first side of the bias unit 20 connects with the common node N, the second side of the bias unit is supplied by a buffered supply voltage which is regulated by some appropriate scheme, and the third side of the bias unit outputs the triple-push output signal Vout1.

The first delay cell D1 comprises an NMOS transistor M1 and a PMOS transistor M'1. The drain of the NMOS transistor M1 connects with the drain of the PMOS transistor M'1 to form an output of the first delay cell D1. The source of the NMOS transistor M1 is grounded, the gate of the NMOS transistor M1 connects with the input of the first delay cell D1, the gate of the PMOS transistor M'1 connects with the control voltage Vcont, the source of the PMOS M'1 connects with one side of a thin-film microstrip (TFMS) line W1, and the other side of the TFMS line W1 connects with the power source terminal of the first delay cell. The TFMS line W1 is used to equalize the phase of the first delay cell D1 to increase the output power, and shrink the area of the circuit of the ring-based triple-push VCO 3. The internal connection in the second delay cell D2 and the last delay cell Df are similar to that of the first delay cell D1.

The first buffer amplifier B1 comprises an open drain buffer transistor M"1 and a TFMS line W'1. The drain of the open drain buffer transistor M"1 connects with one side of the TFMS line, the other side of the TFMS line W'1 connects with the output of the buffer amplifier, the source of the open drain buffer transistor M"1 is grounded, and the gate of the open drain buffer transistor M"1 connects with the output of the first delay cell D1. The internal connection in the second buffer amplifier B2 and the last buffer amplifier Bf are similar to that of the first buffer amplifier B1.

The bias unit 20 comprises a bias inductor L and an isolated capacitor C'. One side of the bias inductor L connects with the second side of the bias unit 20, and the other side of the bias inductor L and one side of the isolated capacitor C' connect with the first side of the bias unit 20, and the other side of the isolated capacitor C' connects with the third side of the bias unit 20. The isolated capacitor C' is used to extract the triple-push output signal Vout1 without imposing additional loading effect upon the buffer amplifiers, as shown in FIG. 3.

The triple-push VCO 3 can automatically provide three signals, and each signal has a phase difference of 120° in the fundamental and the second harmonic frequency. The signals of the fundamental and the second harmonic frequency are cancelled out completely due to phase destructive combination, and thus the triple-push output signal Vout1 is the in-phase constructive combination of the output signals of the last harmonic frequency. The frequency tuning range of the triple-push output signal Vout1 is increased by 3 times than original tuning frequency range.

The above-mentioned only utilizes three delay cells to describe the embodiment according the present invention. However, the ring-based multi-push VCO can be implemented by a plurality of delay cells.

Figure 4:
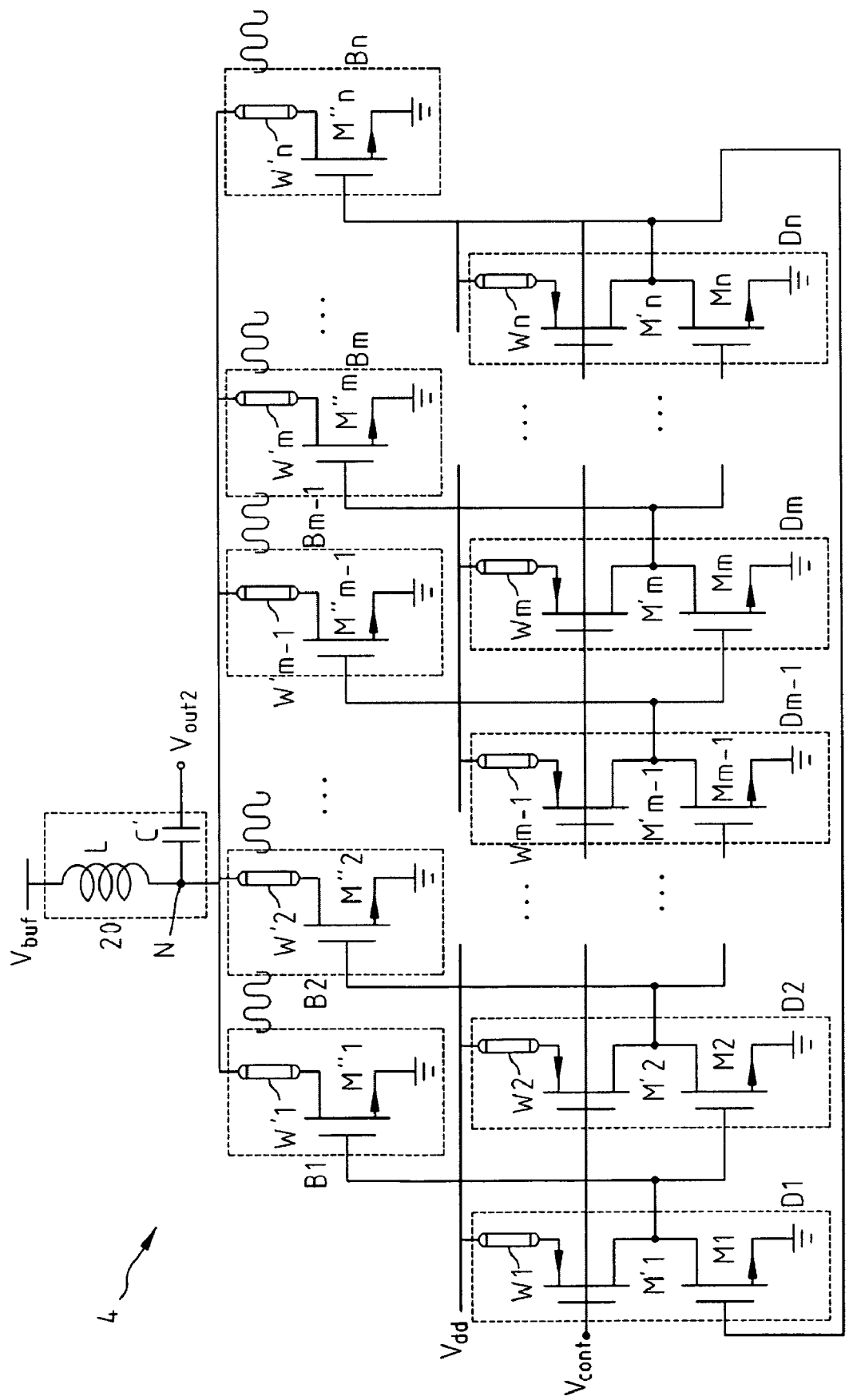
FIG. 4 is a schematic diagram illustrating the second embodiment according to the present invention.

FIG. 4 is a diagram illustrating the second embodiment according to the present invention, in which n delay cells, n buffer amplifiers, and a bias unit 20 are used, and n is a positive integer that great than 3. The n delay cells comprise a first delay cell D1, a second delay cell D2, . . . , and an nth delay cell Dn. Each delay cell receives the control voltage Vcont. The power source terminal of each delay cell connects with the power voltage Vdd, the ground terminal of each delay cell is grounded, and the output of an (m−1)th delay cell Dm−1 connects with an input of an mth delay cell Dm, where m is a positive integer that is greater than 1 and less than n+1. Further, the output of the nth delay cell Dn connects with the input of the first delay cell D1.

The n buffer amplifiers comprise a first buffer amplifier B1, a second buffer amplifier B2, . . . , and the nth buffer amplifier Bn. An input of the mth buffer amplifier Bm connects with an output of the mth delay cell Dm, where m is a positive integer that is greater than 0 and less than n+1. The n buffer amplifiers connect with a common node N. A first side of the bias unit 20 connects with the common node N, a second side of the bias unit 20 is supplied with to a buffered supply voltage Vbuf, and a third side of the bias unit 20 outputs the multi-push output signal Vout2.

The first delay cell D1 comprises an NMOS transistor M1 and a PMOS transistor M'1. The drain of the NMOS transistor M1 connects with the drain of the PMOS transistor M'1 to form an output of the first delay cell D1. The source of the NMOS transistor M1 is grounded. The gate of the NMOS transistor M1 connects with the input of the first delay cell D1, and the gate of the PMOS transistor M'1 connects with the control voltage Vcont. The source of the PMOS M'1 connects with one side of the TFMS line W1, and the other side of the TFMS line W1 connects with the power source terminal of the first delay cell, wherein the TFMS line W1 is used to equalize the phase of the first delay cell D1. Other delay cells have the same structure as the first delay cell D1.

The first buffer amplifier B1 comprises an open drain buffer transistor M"1 and a TFMS line W'1. The drain of the open drain buffer transistor M"1 connects with one side of the TFMS line W'1, and the other side of the TFMS line W'1 connects with the output of the buffer amplifier. The source of the open drain buffer transistor M"1 is grounded. The gate of the open drain buffer transistor M"1 connects with the output of the first delay cell D1. Other buffer amplifiers have the same structure as the buffer amplifier B1.

The bias unit 20 has the same structure as the first embodiment. The multi-push output signal Vout2 is generated in the ring-based multi-push VCO 4, as shown in FIG. 4.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A ring-based multi-push voltage-controlled oscillator, for receiving a control voltage and tuning a frequency of a multi-push output signal, comprising:
    a plurality of delay cells, comprising at least a first delay cell, a second delay cell, and a last delay cell, wherein the first, second, and last delay cells receive the control voltage, a power source terminal of the first delay cell connects with a power voltage, a ground terminal of the first delay cell is grounded, a power source terminal of the second delay cell connects with the power voltage, a ground terminal of the second delay cell is grounded, a power source terminal of the last delay cell connects with the power voltage, a ground terminal of the last delay cell is grounded, an output of the first delay cell connects with an input of the second delay cell, an output of the second delay cell connects with an input of the last delay cell, and an output of the last delay cell connects with an input of the first delay cell;
    a plurality of buffer amplifiers, comprising at least a first buffer amplifier, a second buffer amplifier, and a last buffer amplifier, wherein an input of the first buffer amplifier connects with the output of the first delay cell, an input of the second buffer amplifier connects with the output of the second delay cell, an input of the last buffer amplifier connects with the output of the last delay cell, and an output of the first buffer amplifier, an output of the second buffer amplifier, and an output of the last buffer amplifier connect with a common node; and
    a bias unit, having a first side connecting with the common node, a second side supplied with a buffered supply voltage, and a third side outputting the multi-push output signal;
    wherein each buffer amplifier comprises an open drain buffer transistor and a first thin-film microstrip (TFMS) line, a drain of the open drain buffer transistor connects with one side of the first TFMS line, the other side of the first TFMS line connects with the output of the buffer amplifier, a source of the open drain buffer transistor is grounded, and a gate of the open drain buffer transistor connects with the output of the delay cell connected to the buffer amplifier.

2. The ring-based multi-push voltage-controlled oscillator according to claim 1, wherein each delay cell comprises an NMOS transistor and a PMOS transistor, a drain of the NMOS transistor connects with a drain of the PMOS transistor to form an output of the delay cell, a source of the NMOS transistor is grounded, a gate of the NMOS transistor connects with the input of the delay cell, a gate of the PMOS transistor connects with the control voltage, a source of the PMOS transistor connects with one side of a second TFMS line, and the other side of the second TFMS line connects with the source of delay cell.

3. The ring-based multi-push voltage-controlled oscillator according to claim 1, wherein the bias unit comprises a bias inductor and an isolated capacitor, one side of the bias inductor connects with the second side of the bias unit, the other side of the bias inductor and one side of the isolated capacitor connect with the first side of the bias unit, and the other side of the isolated capacitor connects with the third side of the bias unit.

4. A ring-based multi-push voltage-controlled oscillator, for receiving a control voltage and tuning the frequency of a multi-push output signal, the ring-based multi-push VCO comprising:
    n delay cells, wherein n is a positive integer greater than 3, the n delay cells comprise a first delay cell, a second delay cell, and an nth delay cell, each delay cell receives the control voltage, a power source terminal of each delay cell connects with a power voltage, a ground terminal of each delay cell is grounded, an output of an (m−1)th delay cell connects with an input of an mth delay cell, where m is a positive integer greater than 1 and less than n+1, and an output of the nth delay cell connects with an input of the first delay cell;
    n buffer amplifiers, wherein n is a positive integer greater than 3, the n buffer amplifiers comprise a first buffer amplifier, a second buffer amplifier, and an nth buffer amplifier, an input of an mth buffer amplifier connects with an output of the mth delay cell, where m is a positive integer greater than 3 and less than n+1, and the n buffer amplifiers all connect with a common node; and
    a bias unit, having a first side connecting with the common node, a second side supplied with a buffered supply voltage, and a third side outputting the multi-push output signal;
    wherein each delay cell comprises an NMOS transistor and a PMOS transistor, a drain of the NMOS transistor connects with a drain of the PMOS transistor to form an output of the delay cell, a source of the NMOS transistor is grounded, a gate of the NMOS transistor connects with the input of the delay cell, a gate of the PMOS transistor connects with the control voltage, a source of the PMOS transistor connects with one side of a first thin-film microstrip (TFMS) line, and the other side of the first TFMS line connects with the source of delay cell.

5. The ring-based multi-push voltage-controlled oscillator according to claim 4, wherein each buffer amplifier comprises an open drain buffer transistor and a second TFMS line, a drain of the open drain buffer transistor connects with one side of the second TFMS line, the other side of the second TFMS line connects with the output of the buffer amplifier, a source of the open drain buffer transistor is grounded, and a gate of the open drain buffer transistor connects with the output of the delay cell connected to the buffer amplifier.

6. The ring-based multi-push voltage-controlled oscillator according to claim 4, wherein the bias unit comprises a bias inductor and an isolated capacitor, one side of the bias inductor connects with the second side of the bias unit, the other side of the bias inductor and one side of the isolated capacitor connect with the first side of the bias unit, and the other side of the isolated capacitor connects with the third side of the bias unit.

* * * * *